United States Patent
Shim et al.

(10) Patent No.: US 12,316,336 B2
(45) Date of Patent: May 27, 2025

(54) SYSTEMS FOR AND METHODS OF PHASE INTERPOLATION

(71) Applicant: Avago Technologies International Sales Pte. Limited, Singapore (SG)

(72) Inventors: Yonghyun Shim, Irvine, CA (US); Yu-Ming Ying, Irvine, CA (US); Guansheng Li, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 43 days.

(21) Appl. No.: 18/330,719

(22) Filed: Jun. 7, 2023

(65) Prior Publication Data
US 2024/0413827 A1    Dec. 12, 2024

(51) Int. Cl.
*H03K 3/03*      (2006.01)
*H03L 7/24*      (2006.01)
*H04L 7/00*      (2006.01)

(52) U.S. Cl.
CPC ............. *H03L 7/24* (2013.01); *H03K 3/0322* (2013.01); *H04L 7/0025* (2013.01); *H04L 7/0037* (2013.01)

(58) Field of Classification Search
CPC ...... H03K 3/0315; H03K 3/0322; H03L 7/24; H04L 7/0025; H04L 7/0037
See application file for complete search history.

(56) References Cited

U.S. PATENT DOCUMENTS

| | | | |
|---|---|---|---|
| 9,444,435 B1* | 9/2016 | Monaco | H03K 3/0322 |
| 10,237,052 B1* | 3/2019 | Moscone | H03L 7/081 |
| 10,333,533 B1* | 6/2019 | Moscone | H03H 11/00 |
| 10,715,150 B1* | 7/2020 | Carey | H03K 21/10 |
| 11,095,426 B1* | 8/2021 | Li | H03K 3/0322 |
| 11,698,658 B1* | 7/2023 | Allen | H03K 5/1565 |
| | | | 327/291 |
| 2009/0033430 A1* | 2/2009 | Jang | H03B 19/14 |
| | | | 331/57 |
| 2011/0187469 A1* | 8/2011 | Okada | H03L 7/24 |
| | | | 331/117 FE |
| 2013/0002318 A1* | 1/2013 | Lu | H03L 7/099 |
| | | | 327/156 |
| 2014/0035650 A1* | 2/2014 | Zerbe | H03L 7/0995 |
| | | | 327/299 |
| 2014/0266471 A1* | 9/2014 | Zhu | H03L 7/18 |
| | | | 331/34 |
| 2016/0248377 A1* | 8/2016 | Lee | H03K 3/0315 |
| 2021/0067166 A1* | 3/2021 | Liu | H03L 7/23 |
| 2022/0244755 A1 | 8/2022 | Wang et al. | |

OTHER PUBLICATIONS

Foreign Search Report on non-Foley case related to U.S. Appl. No. 18/330,719 Dtd Nov. 8, 2024.

* cited by examiner

*Primary Examiner* — Levi Gannon
(74) *Attorney, Agent, or Firm* — Foley & Lardner LLP (57) ABSTRACT

A system includes a first phase interpolator, a second phase interpolator, and a circuit. The circuit is configured to receive a first signal and a second signal provided by the first phase interpolator and a third signal and a fourth signal provided by the second phase interpolator. The first circuit is configured to provide at least eight phase signals, each of the eight phase signals being at a respective phase angle in response to the first signal, the second signal, the third signal and the fourth signal.

20 Claims, 5 Drawing Sheets

SYSTEMS FOR AND METHODS OF PHASE INTERPOLATION

FIELD OF THE DISCLOSURE

This disclosure generally relates to systems for and methods of phase interpolation and clock signal generation, including but not limited to systems for and methods of skew and/or jitter reduction associated with clock signals and/or data transfers in a communication system.

BACKGROUND OF THE DISCLOSURE

Data communication systems (e.g., WiFi networks, fiber networks, Ethernets, wide area networks, local areas networks, storage networks, cellular networks, etc.) often use clock signals to synchronize operations. One example of a data communication system is a passive optical network (PON). A PON can use fiber-optic telecommunications technology to deliver broadband network access to end-customers. The PON can implement a point-to-multipoint topology in which a single optical fiber serves multiple endpoints by using unpowered or passive fiber optic splitters to divide the fiber bandwidth among the endpoints. The endpoints include an electronic data transceiver on a medium, such as a wired medium (e.g., a cable).

The data transceiver often includes a serializer/deserializer (SERDES) to transmit data on a recovered clock signal. The SERDES employs phase interpolators (PIs) or similar functional circuits to offset a transmit (or receive) phase over time and/or over frequency relative to a local timing reference so that the SERDES can transmit (or receive) data at the same frequency as a frequency of data transmitted (or received) from a far-end peer device as detected by the SERDES receiver (or transmitter). The sampling margins of receivers using multi-phase clock signals can be affected by static and dynamic skew of interleaved clock paths.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

For purposes of reading the description of the various embodiments below, the following descriptions of the sections of the specification and their respective contents can be helpful:

Section A describes a network environment and computing environment which can be useful for practicing embodiments described herein; and Section B describes embodiments of systems for and methods of reducing skew in a communication, storage or computing environment.

Some embodiments relate to a system for providing phase output signals. The system includes a first phase interpolator, a second phase interpolator, and a first circuit. The first circuit is configured to receive a first signal and a second signal provided by the first phase interpolator and a third signal and a fourth signal provided by the second phase interpolator. The first circuit is configured to provide at least eight phase signals, each of the eight phase signals being at a respective phase angle in response to the first signal, the second signal, the third signal and the fourth signal.

In some embodiments, the first circuit is configured as an injection locked oscillator. In some embodiments, the first circuit comprises a number of amplifiers. Each of the amplifiers includes an inverting output and a non-inverting output. Each of the non-inverting output and the inverting output provide one of the phase signals. In some embodiments, the first circuit includes switches, and each switch is disposed between the non-inverting output and the inverting output of a respective one of the amplifiers. In some embodiments, the amplifiers each include an inverting input and a non-inverting input. An inverting output of a first amplifier of the amplifiers is coupled to a non-inverting input of a second amplifier of the amplifiers, and a non-inverting output of the first amplifier is coupled to an inverting input of the second amplifier. In some embodiments, an inverting output of the second amplifier is coupled to an inverting input of a third amplifier of the amplifiers, and a non-inverting output of the second amplifier is coupled to a non-inverting input of the third amplifier. In some embodiments, an inverting output of the third amplifier is coupled to a non-inverting input of a fourth amplifier of the amplifiers, and a non-inverting output of the third amplifier is coupled to an inverting input of the fourth amplifier.

In some embodiments, the amplifiers are operational amplifiers. In some embodiments, the switches each include a gate configured to receive one of the first signal, the second signal, the third signal or the fourth signal. In some embodiments, the first signal is an in-phase signal, and the third signal is a quadrature signal. In some embodiments, a second circuit is configured to buffer input signals related to the first signal, the second signal, the third signal, and the fourth signal and the second circuit receives a first skew control signal. In some embodiments, a third circuit is configured to buffer the eight phase signals. The third circuit receives a second skew control signal.

Some embodiments relate to a device. The device includes a first circuit configured to provide a first phase signal at a first inverting output and a second phase signal at a first non-inverting output. The first phase signal has a phase difference of 180 degrees with respect to the second phase signal. The device also includes a second circuit configured to receive the first phase signal at a second non-inverting input and the second phase signal at a second inverting input and provide a third phase signal at a second inverting output and a fourth phase signal at a second non-inverting output. The fourth phase signal has a phase difference of 180 degrees with respect to the third phase signal. The device also includes a first switch configured to connect the first inverting output to the first non-inverting output in response to a first clock signal.

In some embodiments, the first clock signal is provided by a first phase interpolator. In some embodiments, a third circuit is configured to receive the third phase signal at a third inverting input and the fourth phase signal at a third non-inverting input and provide a fifth phase signal at a third inverting output and a sixth phase signal at a third non-inverting output. The fifth phase signal has a phase difference of 180 degrees with respect to the sixth phase signal. The device also includes a second switch configured to connect the second inverting output to the second non-inverting output in response to a second clock signal in some embodiments. The second clock signal has a phase difference of 90 degrees with respect to the first clock signal.

In some embodiments, the device further includes a fourth circuit configured to receive the fifth phase signal at a fourth inverting input and the sixth phase signal at a fourth non-inverting input and provide a seventh phase signal at a fourth inverting output and an eighth phase signal at a fourth non-inverting output. The seventh phase signal has a phase difference of 180 degrees with respect to the eighth phase signal. The device further includes a third switch configured to connect the third inverting output to the third non-inverting output in response to a third clock signal in some embodiments. The third clock signal has a phase difference of 180 degrees with respect to the first clock signal.

In some embodiments, the device further includes a fourth switch. The fourth non-inverting output is coupled to a first non-inverting input of the first circuit, and the fourth inverting output is coupled to a first inverting input of the first circuit. The fourth switch is configured to connect the fourth inverting output to the fourth non-inverting output in response to a fourth clock signal, and the fourth clock signal has a phase difference of 270 degrees with respect to the first clock signal.

Some embodiments relate to a method. The method includes receiving a first clock signal and a second clock signal provided by a first phase interpolator, and receiving a third clock signal and a fourth clock signal provided by a second phase interpolator. The first clock signal, the second clock signal, the third clock signal, and the fourth clock signal are each at a respective phase angle. The method further includes using an oscillator to provide a number of phase signals each being at a respective phase angle. The number of the phase signals is more than four. The method further includes providing the phase signals to a first buffer and correcting skew associated with the phase signals in the first buffer using a first skew control signal.

In some embodiments, the method further includes controlling switches in the oscillator using the first clock signal, the second clock signal, the third clock signal, and the fourth clock signal. In some embodiments, the oscillator is an injection locked oscillator. In some embodiments, the method further includes providing input clock signals to a second buffer, correcting skew associated with the input clock signals in the second buffer using a second skew control signal, and providing the input clock signals from the second buffer to the first phase interpolator and the second phase interpolator.

A phase adjustment may refer to a change a phase of a signal in some embodiments. A phase adjustment can be an increase or reduction in the phase of a signal by a fixed or proportional amount.

A. Computing and Network Environment

Figure 1A:
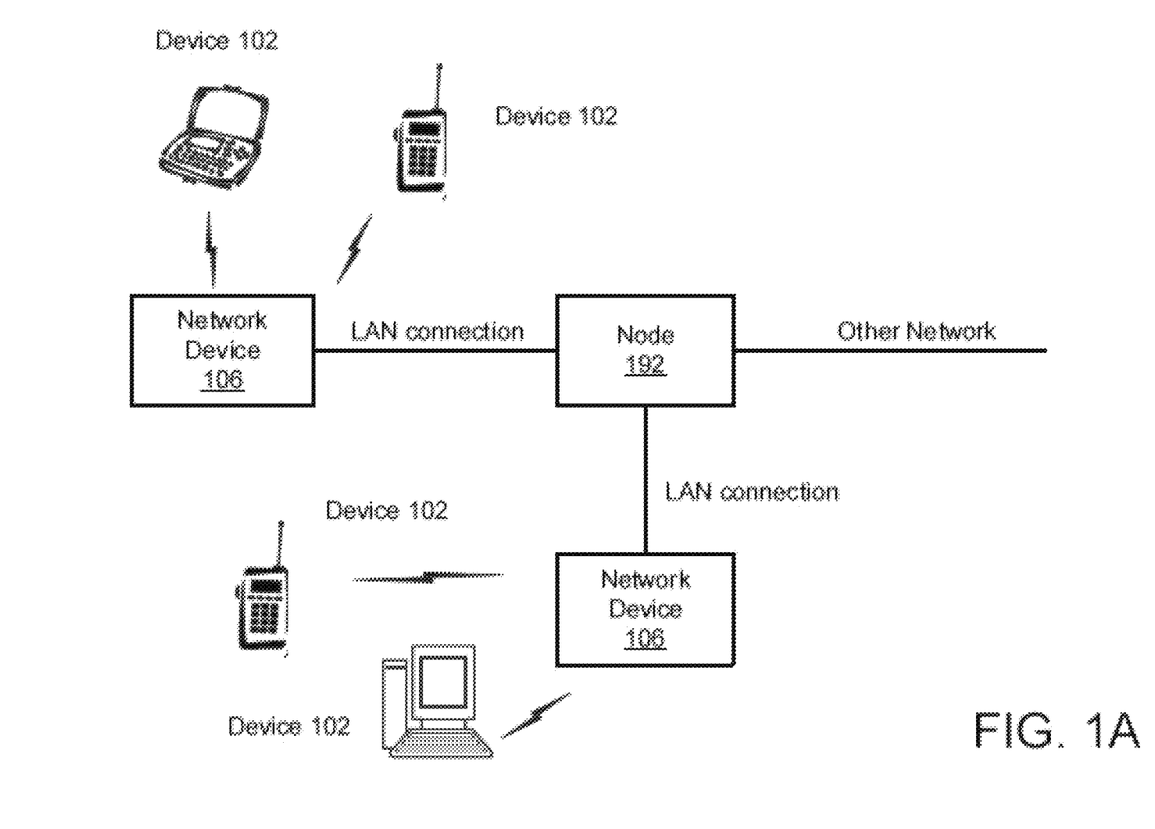
FIG. 1A is a schematic block diagram depicting an embodiment of a network environment including one or more wireless communication devices in communication with one or more devices or stations.

Prior to discussing specific embodiments of the present solution, aspects of the operating environment as well as associated system components (e.g., hardware elements) are described in connection with the methods and systems described herein. Referring to FIG. 1A, an embodiment of a network environment is depicted. In brief overview, the network environment includes a wireless communication system that includes one or more base stations 106, one or more wireless communication devices 102 and a network hardware component or network hardware. The wireless communication devices 102 can for example include laptop computers 102, tablets 102, personal computers 102 and/or cellular telephone devices 102. The details of an embodiment of each wireless communication device and/or base station are described in greater detail with reference to FIGS. 1B and 1C. The network environment can be an ad hoc network environment, an infrastructure wireless network environment, a subnet environment, etc., in one embodiment.

Terms such as "wireless communication device", "user equipment," "mobile station," "mobile," "mobile device," "subscriber station," "subscriber equipment," "access terminal," "terminal," "handset," and similar terminology, can refer to a wireless device utilized by a subscriber or user of a wireless communication service to receive or convey data, control, voice, video, sound, gaming, or substantially any data-stream or signaling-stream. The foregoing terms can be utilized interchangeably in the present disclosure. Likewise, terms such as "access point (AP)," "wireless access point (WAP)," "base station," "base transceiver station", "Node B," "evolved Node B (eNode B or eNB)," home Node B (HNB)," "home access point (HAP)," and similar terminology, can be utilized interchangeably in the present disclosure, and refer to a wireless network component or apparatus that serves and receives data, control, voice, video, sound, gaming, or substantially any data-stream or signaling-stream from a set of wireless devices. Phase interpolators may refer to circuits or devices that can shift a clock signal in phase according to an analog or digital command in some embodiments.

Referring again to FIG. 1A, the network devices 106 can be operably coupled to network hardware via local area network connections. The network hardware, which can include a router, gateway, switch, bridge, modem, system controller, appliance, etc., can provide a local area network connection for the communication system. Each of the network devices 106 can have an associated antenna or an antenna array to communicate with the wireless communication devices 102 in its area. The wireless communication devices 102 can register with a particular access point or base station 106 to receive services from the communication system (e.g., via a SU-MIMO or MU-MIMO configuration). For direct connections (e.g., point-to-point communications), some wireless communication devices 102 can communicate directly via an allocated channel and communications protocol. Some of the wireless communication devices 102 can be mobile or relatively static with respect to the access point or base station 106.

In some embodiments, a base station 106 includes a device or module (including a combination of hardware and software) that allows wireless communication devices 102 to connect to a wired network using LTE, Wi-Fi, and/or other standards. A base station 106 can be implemented, designed and/or built for operating in a wireless local area network (WLAN), such as in a cellular network. A base station 106 can connect to a router (e.g., via a wired network) as a standalone device in some embodiments. In other embodiments, a base station can be a component of a router. A base station 106 can provide multiple devices 102 access to a network. A base station 106 can, for example, connect to a wired Ethernet connection and provide wireless connections using radio frequency links for other devices 102 to utilize that wired connection. A base station 106 can be built and/or implemented to support a standard for sending and receiving data using one or more radio frequencies. Those standards and the frequencies they use can be defined by the IEEE or 3GPP for example. A base station 106 can be implemented and/or used to support cellular coverage, public Internet hotspots, and/or on an internal network to extend the network's signal (e.g., Wi-Fi) range.

In some embodiments, the network device 106 can be used for (e.g., in-home or in-building) wireless networks (e.g., IEEE 802.11, Bluetooth, ZigBee, cellular, any other type of radio frequency based network protocol and/or variations thereof). Each of the wireless communication devices 102 can include a built-in radio and/or is coupled to a radio. Such wireless communication devices 102 and/or network device 106 can operate in accordance with the various aspects of the disclosure as presented herein to enhance performance, reduce costs and/or size, and/or enhance broadband applications. Each wireless communication devices 102 can have the capacity to function as a client node seeking access to resources (e.g., data, and connection to networked nodes such as servers) via one or more base stations 106.

The network connections can include any type and/or form of network and can include any of the following: a point-to-point network, a broadcast network, a telecommunications network, a data communication network, a computer network. The topology of the network can be a bus, star, or ring network topology. The network can be of any such network topology as known to those ordinarily skilled in the art capable of supporting the operations described herein. In some embodiments, different types of data can be transmitted via different protocols. In other embodiments, the same types of data can be transmitted via different protocols.

Figure 1B:
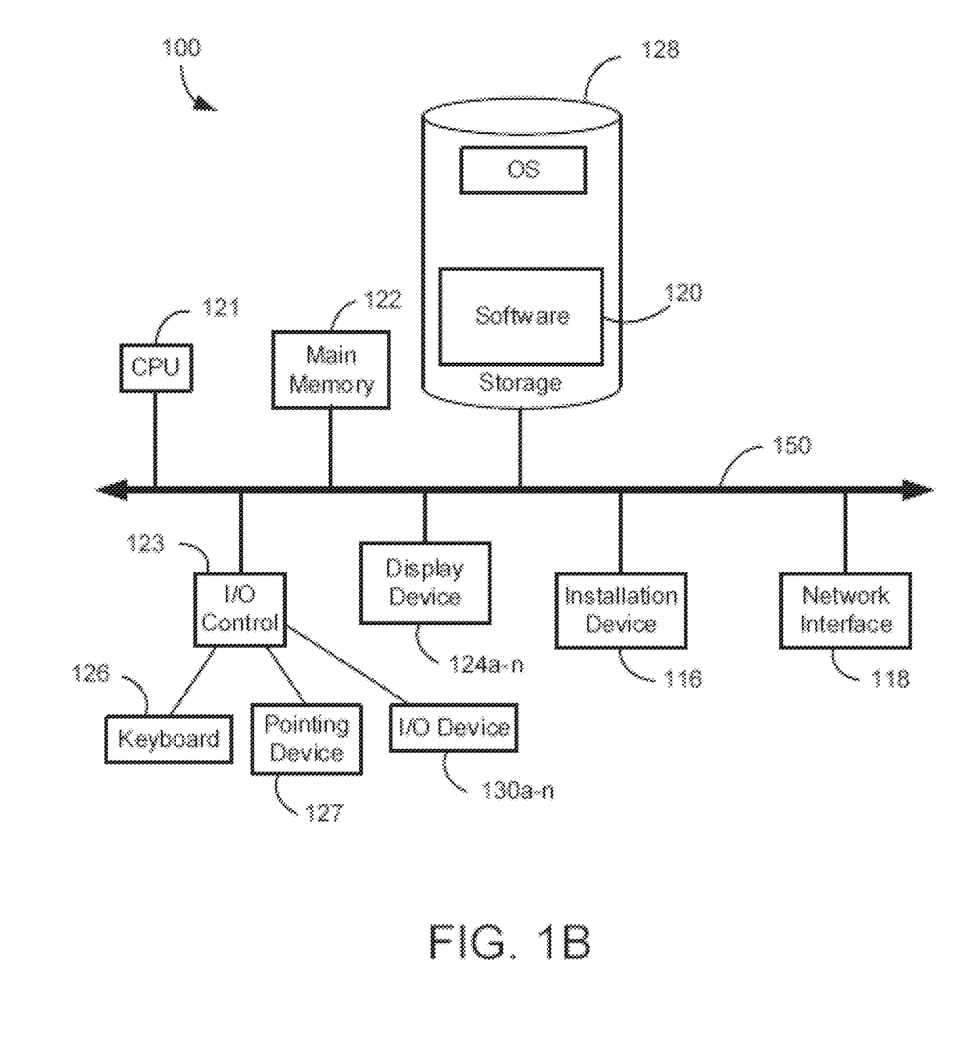
FIGS. 1B and 1C are schematic block diagrams depicting embodiments of computing devices useful in connection with the methods and systems described herein.
Figure 1C:
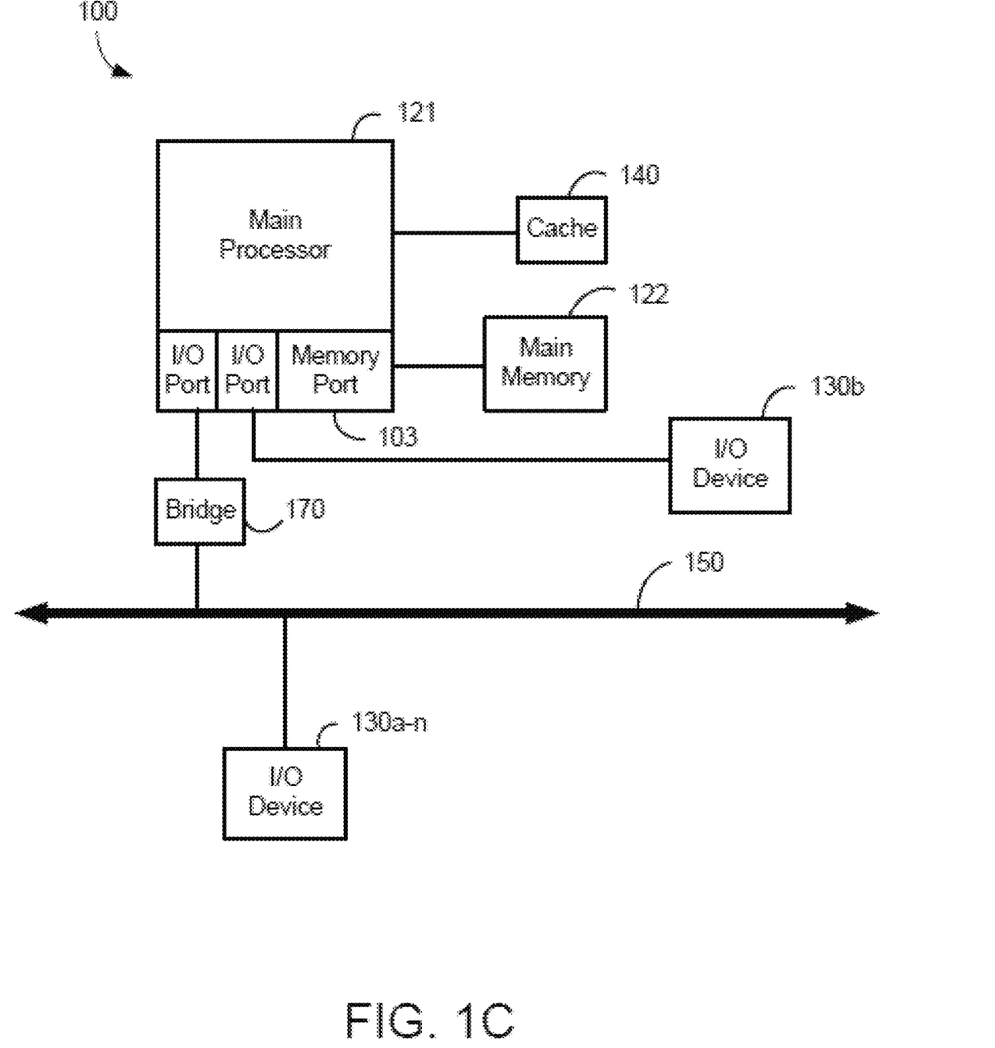

The communications device(s) 102 and base station(s) 106 can be deployed as and/or executed on any type and form of computing device, such as a computer, network device or appliance capable of communicating on any type and form of network and performing the operations described herein. FIGS. 1B and 1C depict block diagrams of a computing device 100 useful for practicing an embodiment of the wireless communication devices 102 or the base station 106. As shown in FIGS. 1B and 1C, each computing device 100 includes a central processing unit 121, and a main memory unit 122. As shown in FIG. 1B, a computing device 100 can include a storage device 128, an installation device 116, a network interface 118, an I/O controller 123, display devices 124a-124n, a keyboard 126 and a pointing device 127, such as a mouse. The storage device 128 can include, without limitation, an operating system and/or software. As shown in FIG. 1C, each computing device 100 can also include additional optional elements, such as a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, California; those manufactured by International Business Machines of White Plains, New York; those manufactured by ARM Holdings, plc of Cambridge, England or those manufactured by Advanced Micro Devices of Sunnyvale, California. The computing device 100 can be based on any of these processors, or any other processor capable of operating as described herein.

Main memory unit 122 can be one or more memory chips capable of storing data and allowing any storage location to be directly accessed by the microprocessor or central processing unit 121, such as any type or variant of Static random access memory (SRAM), Dynamic random access memory (DRAM), Ferroelectric RAM (FRAM), NAND Flash, NOR Flash and Solid State Drives (SSD). The main memory unit 122 can be based on any of the above described memory chips, or any other available memory chips capable of operating as described herein. In the embodiment shown in FIG. 1B, the central processing unit 121 communicates with main memory unit 122 via a system bus 150 (described in more detail below). FIG. 1C depicts an embodiment of a computing device 100 in which the processor communicates directly with main memory unit 122 via a memory port 103. For example, in FIG. 1C the main memory unit 122 can be DRAM.

FIG. 1C depicts an embodiment in which the main processor or central processing unit 121 communicates directly with cache memory 140 via a secondary bus, sometimes referred to as a backside bus. In other embodiments, the main processor or central processing unit 121 communicates with cache memory 140 using the system bus 150. Cache memory 140 typically has a faster response time than main memory unit 122 and is provided by, for example, SRAM, BSRAM, or EDRAM. In the embodiment shown in FIG. 1C, the central processing unit 121 communicates with various I/O devices 130a-n via a local system or system bus 150. Various buses can be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the central processing unit 121 can use an Advanced Graphics Port (AGP) to communicate with the display 124. FIG. 1C depicts an embodiment of a computer or computing device 100 in which the main processor or central processing unit 121 can communicate directly with I/O device 130b, for example via HYPERTRANSPORT, RAPIDIO, or INFINIBAND communications technology. FIG. 1C also depicts an embodiment in which local busses and direct communication are mixed: the central processing unit 121 communicates with I/O device 130a using a local interconnect bus while communicating with I/O device 130b directly.

A wide variety of I/O devices 130a-n can be present in the computing device 100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices 130a-n can be controlled by an I/O controller 123 as shown in FIG. 1B. The I/O controller can control one or more I/O devices such as a keyboard 126 and a pointing device 127, e.g., a mouse or optical pen. Furthermore, an I/O device can also provide storage and/or an installation medium or installation device 116 for the computing device 100. In still other embodiments, the computing device 100 can provide USB connections (not shown) to receive handheld USB storage devices such as the USB Flash Drive line of devices manufactured by Twintech Industry, Inc. of Los Alamitos, California.

Referring again to FIG. 1B, the computing device 100 can support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 can further include a storage device, such as one or more hard disk drives or redundant arrays of independent disks, for storing an operating system and other related software, and for storing application software programs such as any program or software 120 for implementing (e.g., built and/or designed for) the systems and methods described herein. Optionally, any of the installation devices 116 could also be used as the storage device. Additionally, the operating system and the software can be run from a bootable medium.

Furthermore, the computing device 100 can include a network interface 118 to interface to a network through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax, LTE, LTE-A and direct asynchronous connections). In one embodiment, the computing device 100 communicates with other computing devices 100' via any type and/or form of gateway or tunneling protocol such as Secure Socket Layer (SSL) or Transport Layer Security (TLS). The network interface 118 can include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 can include or be connected to one or more display devices 124a-124n. As such, any of the I/O devices 130a-130n and/or the I/O controller 123 can include any type and/or form of suitable hardware, software, or combination of hardware and software to support, enable or provide for the connection and use of the display device(s) 124a-124n by the computing device 100. For example, the computing device 100 can include any type and/or form of video adapter, video card, driver, and/or library to interface, communicate, connect or otherwise use the display device(s) 124a-124n. In one embodiment, a video adapter can include multiple connectors to interface to the display device(s) 124a-124n. In other embodiments, the computing device 100 can include multiple video adapters, with each video adapter connected to the display device(s) 124a-124n. In some embodiments, any portion of the operating system of the computing device 100 can be implemented for using multiple displays or display devices 124a-124n. One ordinarily skilled in the art will recognize and appreciate the various ways and embodiments that a computing device 100 can be implemented to have one or more display devices 124a-124n.

In further embodiments, an I/O device 130a-n can be a bridge between the system bus 150 and an external communication bus, such as a USB bus, an Apple Desktop Bus, an RS-232 serial connection, a SCSI bus, a Fire Wire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 100 of the sort depicted in FIGS. 1B and 1C can operate under the control of an operating system, which control scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system or computing device 100 can be any workstation, telephone, sensor, desktop computer, laptop or notebook computer, server, handheld computer, mobile telephone, or other portable telecommunications device, media playing device, a gaming system, mobile computing device, or any other type and/or form of computing, telecommunications or media device that is capable of communication. The computing device 100 has sufficient processor power and memory capacity to perform the operations described herein.

In some embodiments, the computing device 100 can have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Aspects of the operating environments and components described above will become apparent in the context of the systems and methods disclosed herein.

B. Systems for and Methods of Reducing Skew in a Communication, Storage or Computing Environment.

Described herein are systems for and methods of phase interpolation and/or multi-phase clock signal generation. In some embodiments, a phase interpolator is configured to correct for skew (e.g., static skew and dynamic skew) in some embodiments. The dynamic skew can be code dependent skew. The phase interpolator can be used in any product that uses a highly accurate clock signal including but not limited to data centers, network switches, coherent optical transceivers, and 5G/microwave wideband data capture devices in some embodiments. A phase interpolator may refer any circuit for adjusting phase of a signal in some embodiments. The phase interpolator can be provided in a receiver to adjust the phase of sampling clocks in very fine increments and can be used to provide multi-phase clock signals in some embodiments. A phase interpolator can be a current-controlled phase interpolator, a voltage-controlled interpolator, an injection locked oscillator based interpolator, delay locked loop (e.g., delay gate) based phase interpolator, etc. in some embodiments. The phase of a signal can be adjusted according to an analog or digital command or signal in some embodiments. In some embodiments, systems for and methods of phase interpolation are used for clock and data recovery (CDR), loop timing modes, and spread spectrum clocking (SSC).

In some embodiments, systems for and methods of phase interpolation provide higher linearity with more depth of phase interpolation resolution than conventional phase interpolators. In some embodiments, a phase interpolator provides dynamic skew cancellation for advanced modulators (e.g., phase amplitude modulation (PAM) 4 and quadrature amplitude modulation (QAM) 16/64). In some embodiments, the phase interpolator is configured to compensate for phase interpolator integral non-linearity (INL) and code dependent skew and is configured to operate on links with data rates between 56 giga bits per second (Gb/s) and 200 Gb/s. In some embodiments, the phase interpolator operates on links with data rates above 200 Gb/s.

In some embodiments, systems for and methods of phase interpolation are not susceptible to jitter mismatch due to delay components in tunable buffers and skew from injection locked oscillators with asymmetric phase injection. In some embodiments, systems for and methods of phase interpolation do not require inductive filtering techniques to enhance jitter performance. In some embodiments, skew or jitter margins can be increased for other components because SERDES architecture dependent jitter is reduced. In some embodiments, a system on a chip can use the systems and methods and house circuitry therefor.

Skew may refer to a magnitude of the time difference between two events that ideally would occur simultaneously in some embodiments. Skew may include various types of jitter. Jitter may refer to a difference in an actual clock period and an ideal, expected or average clock period in some embodiments. Jitter can involve a deviation in, or displacement of, the signal pulses in a high-frequency digital signal (e.g., clock signal). In some embodiments, jitter corresponds to time domain instabilities. Jitter can have at least two characteristics: (1) frequency components of the variations; and (2) amplitude (e.g., amplitude of time components of the variation). When analyzing jitter of a serial data or a clock, signals are compared with a clean or noise-free clock signal or other signal that is a reference point in some embodiments. In some embodiments, to measure jitter of a serial data, an average ideal clock signal that is relevant to the serial data is measured.

Deterministic jitter may refer to jitter that is bounded, (e.g., with a minimum and maximum extent) in some embodiments. Deterministic jitter is generally different than random jitter, which is Gaussian in nature, and is unbounded. Deterministic jitter can include data-dependent jitter (DDj), periodic jitter (Pj), jitter caused by INL, jitter caused by differential non-linearity (DNL), jitter caused by supply ripple and combinations thereof in some embodiments.

Figure 2:
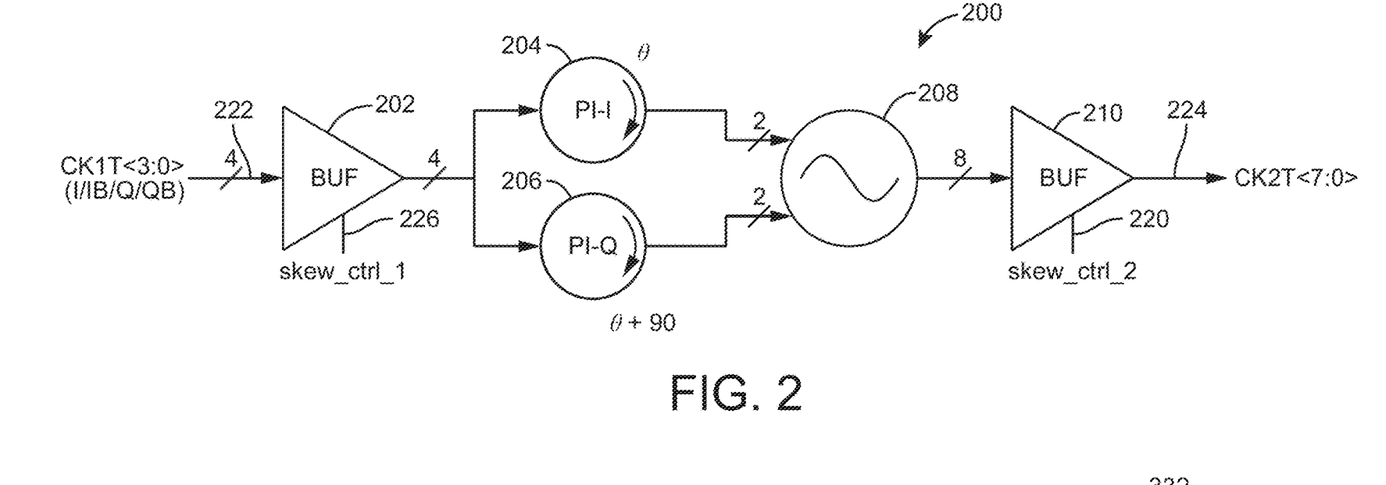
FIG. 2 is a schematic block diagram of a clock signal system including phase interpolators and an injection locked oscillator according to some embodiments.

Referring to FIG. 2, a clock signal system 200 is configured to perform phase interpolation with improved INL and skew performance in some embodiments. System 200 can be part of a SERDES in some embodiments. In some embodiments, the system 200 includes a buffer 202, an in-phase (I) interpolator 204, a quadrature (Q) phase interpolator 206, an injection locked oscillator 208, and a buffer 210. A clock input 222 is coupled to an input of buffer 202, and a clock output 224 is coupled to an output of buffer 210. Clock signal system 200 advantageously has excellent I/Q phase interpolation linearity, well confined skew between interleaved clock paths, and robustness over variations in processing, voltage and temperature in some embodiments. In some embodiments, clock signal system 200 is a second order super harmonic symmetric injection locked oscillator based system. The clock signal system 200 is a multi-phase interleaved system in some embodiments.

Clock input 222 receives a multiphase clock signal in some embodiments. In some embodiments, the multiphase clock signal includes an in-phase signal, an inverse in-phase signal, quadrature signal, and an inverse quadrature signal. Each of the in-phase signal, inverse in-phase signal, quadrature signal, and inverse quadrature signal is provided on its own conductor (e.g., a 4 line clock bus). Clock signal system 200 is configured to increase the number of phase signals provided at clock output 224 to a number above the number of phase signals provided at clock input 222 (e.g., double or quadruple the number). In some embodiments, the clock output 224 provides an in-phase signal, an inverse in-phase signal, quadrature signal, an inverse quadrature signal, a 45 degree phase signal, an inverse 45 degree signal, a 135 degree phase signal, and an inverse 135 degree phase signal. The number of phase signals provided at the clock input 222 and the clock output 224 can vary and be any number (e.g., 2, 4, 6, 8, 12, 16, 32 . . . ) depending on design criteria and system parameters.

A phase signal may refer to a signal with a particular phase angle difference (e.g., 0-360 degrees) from another signal or a reference in some embodiments. Phase signals generally have the same frequency in some embodiments. A phase difference may refer to a difference in the phase angles of the two waves or signals (e.g., two phase signals). A phase angle may refer to an angle representing a difference in phase associated with two signals or a reference (e.g., 0 degrees) in some embodiments. An in-phase signal may refer to any signal provided at a frequency, and a quadrature signal can refer to any signal provided at the frequency with a phase delay (e.g., 90 degrees) with respect to the in-phase signal in some embodiments. An inverse signal may refer to a signal 180 degrees out of phase with respect to another signal in some embodiments. A 45 degree phase signal may refer to a signal 45 degrees out of phase with respect to the in-phase signal in some embodiments. A 135 degree phase signal may refer to a signal 135 degrees out of phase with respect to the in-phase signal in some embodiments.

Buffer 202 provides buffered versions of each of the in-phase signal, inverse in-phase signal, quadrature signal, and inverse quadrature signal. The buffered in-phase signal, buffered inverse in-phase signal, buffered quadrature signal, and buffered inverse quadrature signal are provided to in-phase phase interpolator 204, and the buffered in-phase signal, buffered inverse in-phase signal, buffered quadrature signal, and buffered inverse quadrature signal are provided to quadrature phase interpolator 206.

Buffer 202 is signal buffer circuit and includes a control input 226 in some embodiments. In some embodiments, buffer 202 is a clock signal buffer circuit. The clock signal buffer circuit may refer to any circuit that can buffer, copy, reproduce, or make a derivative of one or more of the signals at an input in some embodiments. Buffer may refer to the act of providing isolation, delay, or temporary storage in a circuit in some embodiments. Buffering may involve copying, delaying, reproducing, making a derivative, etc. The clock signal buffer circuit can include jitter attenuators or jitter cleaners in some embodiments. Control input 226 can receive a skew control signal for clock and data recovery. The skew control signal can be provided to correct for static skew at input 222. The skew control signal can represent a correction for delta $IQ_1$ or the difference between the phase of the in-phase signal and the quadrature signal beyond the expected phase difference. The skew control signal can be provided by a digital calibration circuit.

In some embodiments, the skew control signal is a command that causes buffer 202 to selectively delay one signal (e.g., the in-phase signal, inverse in-phase signal, quadrature signal, and inverse quadrature signal) with respect to another signal to remove skew or other errors in some embodiments. Selectable delay paths can be used to selectively delay a signal in response to the command. In some embodiments, the clock buffer 202 is configured to remove static or residual skew at clock input 222. In some embodiments, residual or static skew can be detected by an even/odd path cross-correlation and compensated using the skew control signal in some embodiments.

In-phase phase interpolator 204 receives the buffered in-phase signal and the buffered inverse in-phase signal from clock buffer 202 and the buffered quadrature signal and the buffered inverse quadrature signal from buffer 202. In-phase phase interpolator 204 is configured to provide a wide operation frequency for phase interpolation of the in-phase signal and the buffered inverse in-phase signal. The phase interpolation is a phase rotation in some embodiments. In some embodiments, in-phase phase interpolator 204 can be circuitry configured to generate a desired phase shift/phase interpolation from a control signal/word. In-phase phase interpolator 204 can each represent a single phase interpolator or multiple phase interpolators and can be implemented as mixers configured to generate phase offset clock signals in some embodiments. In-phase phase interpolator 204 provides a phase interpolated in-phase signal and an inverse phase interpolated in-phase signal to injection locked oscillator 208.

Quadrature phase interpolator 206 receives the buffered in-phase signal and the buffered inverse in-phase signal from clock buffer 202 and the buffered quadrature signal and the buffered inverse quadrature signal from buffer 202. Quadrature phase interpolator 206 is configured to provide a wide operation frequency for phase interpolation of the quadrature signal and the buffered inverse quadrature signal. In some embodiments, quadrature phase interpolator 206 can be circuitry configured to generate a desired phase shift/phase interpolation from a control signal/word. Quadrature phase interpolator 206 and in-phase phase interpolator 204 can each represent a single phase interpolator or multiple phase interpolators and can be implemented as mixers configured to generate phase offset clock signals in some embodiments. Quadrature phase interpolator 206 provides a phase interpolated quadrature phase signal and an inverse phase interpolated quadrature phase signal to injection locked oscillator 208.

Injection locked oscillator 208 receives the phase interpolated in-phase phase signal and the inverse phase interpolated in-phase phase signal from in-phase phase interpolator 204 and the phase interpolated quadrature phase signal and the inverse phase interpolated quadrature phase signal from quadrature phase interpolator 206. The phase interpolated in-phase phase signal, the inverse phase interpolated in-phase phase signal, the phase interpolated quadrature phase signal and the inverse phase interpolated quadrature phase signal are symmetrically injected signals which the injection locked oscillator 208 uses to produce eight phase signals. The number of phase signals can be related to the number of injected signals (e.g., a multiple thereof—2, 4, etc.). The eight phase signals have the one half the frequency of the symmetrically injected signals in some embodiments. Injection locked oscillator 208 is configured to compensate the phase signals for both static and dynamic skew between the phase signals in some embodiments. Injection locked oscillator 208 is configured to provide an in-phase phase signal, an inverse in-phase phase signal, a quadrature phase signal and an inverse phase quadrature phase signal as well as additional phase signals (e.g. a 45 degree phase signal, an inverse phase 45 degree phase signal, a 135 degree phase signal and an inverse phase 135 degree phase signal) in some embodiments. The phase signals can have a phase delay between 0 and 360 degrees at any increment. Injection locked oscillator 208 can filter out input jitter in some embodiments. Injection locked oscillator 208 provides the eight phase signals to buffer 210.

Buffer 210 is similar to buffer 202 and is configured to provide the eight phase signals to clock output 224. Buffer 210 is signal buffer circuit and includes a control input 220 in some embodiments. In some embodiments, buffer 210 is a clock signal buffer circuit. Control input 220 can receive a skew control signal for clock and data recovery. The skew control signal can be provided to correct for static skew at output 224. The skew control signal can represent a correction for delta $IQ_2$ or the difference between the in-phase signal and the quadrature signal beyond the expected phase difference. The skew control signal can be provided by a digital calibration circuit. In analog to digital converter architectures, cross correlation between I and Q paths can be used to detect static I/Q skew at phase interpolator input and output. The skew control signal for buffer 202 can further reduce dynamic skew while the skew control signal for buffer 210 can correct any remaining static skew in the last stage of the clock paths. The skew control signal can represent a correction for delta $IQ_2$ or the difference between the phase of at least one of the phase signals and an expected phase or the difference between a difference in phases between two of the phase signals and an expected difference in embodiments. A skew control signal may refer to a signal (e.g., a command) for adjusting phase relationships to reduce skew in some embodiments. A skew control signal can be a digital or analog signal.

In some embodiments, the skew control signal is a command that causes buffer 210 to selectively delay one signal (e.g., provide the in-phase phase signal and the inverse in-phase phase signal, the quadrature phase signal, the 45 degree phase signal, the inverse phase 45 degree phase signal, the 135 degree phase signal and the inverse phase 135 degree phase signal) with respect to another signal to remove skew or other errors. In some embodiments, the buffer 210 is configured to remove static or residual skew at clock output 224. In some embodiments, residual or static skew can be detected between all paths by an even/odd path cross-correlation and compensated using the skew control signal in some embodiments.

Figure 3:
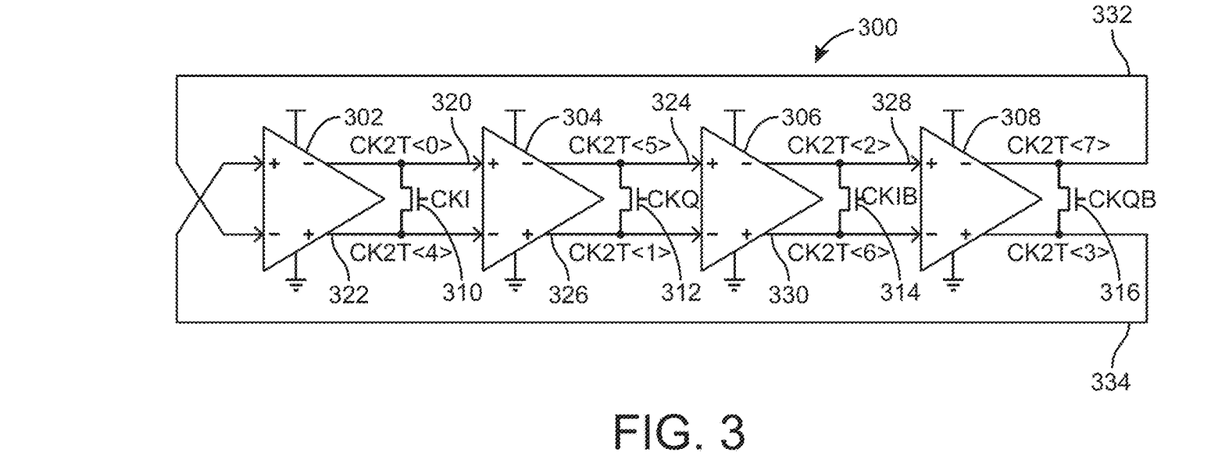
FIG. 3 is a more detailed schematic block diagram of the injection locked oscillator illustrated in FIG. 2 according to some embodiments.

With reference to FIG. 3, the phase interpolated in-phase phase signal, the phase interpolated quadrature phase signal, the inverse phase interpolated in-phase phase signal and the inverse phase interpolated quadrature phase signal can be used to control injection locked oscillator 208 (FIG. 2). Injection locked oscillator 300 includes a number of amplifiers, such as differential amplifiers or operational amplifiers 302, 304, 306, and 308. The number of operational amplifiers 302, 304, 306, and 308 can be equal to the number of output phase signals divided by 2 or the number of input phase signals at clock input 222. Injection locked oscillator 300 includes a number of switches, such as switches 310, 312, 314, and 316. The number of switches 310, 312, 314, and 316 can be equal to the number of output phase signals divided by 2 or the number of input phase signals at clock input 222.

Operational amplifiers 302, 304, 306, and 308 are coupled in a loop fashion in some embodiments. The non-inverting input of amplifier 302 is coupled to the non-inverting output of amplifier 308, and the inverting input of amplifier 302 is coupled to the inverting output of amplifier 308 in some embodiments. The non-inverting input of amplifier 304 is coupled to the inverting output of amplifier 302, and the inverting input of amplifier 304 is coupled to the non-inverting output of amplifier 302 in some embodiments. The non-inverting input of amplifier 306 is coupled to the inverting output of amplifier 304, and the inverting input of amplifier 306 is coupled to the non-inverting output of amplifier 304 in some embodiments. The non-inverting input of amplifier 308 is coupled to the inverting output of amplifier 306, and the inverting input of amplifier 308 is coupled to the non-inverting output of amplifier 306 in some embodiments.

Switch 310 is disposed between non-inverting input of amplifier 304 and the inverting input of amplifier 304 with a drain coupled to a node 320 and a source coupled to a node 322 in some embodiments. Switch 312 is disposed between non-inverting input of amplifier 306 and the inverting input of amplifier 306 with a drain coupled to a node 324 and a source coupled to a node 326 in some embodiments. Switch 314 is disposed between non-inverting input of amplifier 308 and the inverting input of amplifier 308 with a drain coupled to a node 328 and a source coupled to a node 330 in some embodiments. Switch 316 is disposed between non-inverting input of amplifier 302 and the inverting input of amplifier 302 with a drain coupled to a node 332 and a source coupled to a node 334 in some embodiments.

Switches 310, 312, 314, and 316 are transistors (e.g., metal oxide field effect transistors (MOSFETS) in some embodiments. Switches 310, 312, 314, and 316 each include a gate coupled to receive one of the phase interpolated in-phase phase signal, the phase interpolated quadrature phase signal, the inverse phase interpolated in-phase phase signal and the inverse phase interpolated quadrature phase signal, respectively. The phase interpolated in-phase phase signal, the phase interpolated quadrature phase signal, the inverse phase interpolated in-phase phase signal and the inverse phase interpolated quadrature phase signal are provided from phase interpolators 204 and 206 (FIG. 2) and open and close respective switches 310, 312, 314 and 316 in some embodiments. The phase interpolated in-phase phase signal, the phase interpolated quadrature phase signal, the inverse phase interpolated in-phase phase signal and the inverse phase interpolated quadrature phase signal are injected symmetrically into the injection locked oscillator in some embodiments. Due to the nature of the phase tracking in a symmetric injection locked oscillator, compensation can be provided for any non-ideal skew between the four injected phase signals (e.g., the phase interpolated in-phase phase signal, the phase interpolated quadrature phase signal, the inverse phase interpolated in-phase phase signal and the inverse phase interpolated quadrature phase signal).

An injection locked oscillator may refer to a circuit that produces one or more periodic or oscillating signals. The signals can be sine waves, square waves, clock signals, saw tooth signals, etc. in some embodiments. The circuit can use injection locking to synchronize a signal to another signal. An amplifier may refer to a circuit that receives an input signal and provides an output signal according to a gain. The gain can be any number including numbers above, below and equal to 1. An operational amplifier may refer to an amplifier with a gain and an input impedance in some embodiments. The gain and input impedance can be relatively high in some embodiments. An operational amplifier can have inverting and non-inverting inputs and outputs for performing operations on an input voltage in some embodiments. Operational amplifiers generally operate according to a current rule where no current flow into the inverting and non-inverting inputs and a voltage rule where the output of the operational amplifier attempts to ensure that the voltage difference between the inverting and non-inverting inputs is zero in some embodiments. An inverting input may refer to a circuit input where changes in a signal at a non-inverting output are 180 degrees out of phase from changes at the inverting input in some embodiments. A non-inverting input may refer to a circuit input where changes in a signal at the non-inverting input are 180 degrees out of phase from changes at the inverting output in some embodiments. A non-inverting output may refer to a circuit output where changes in a signal at an inverting input are 180 degrees out of phase from changes at the non-inverting output in some embodiments. An inverting output may refer to a circuit output where changes in a signal at a non-inverting input are 180 degrees out of phase from changes at the inverting output in some embodiments. Non-inverting inputs and outputs are marked with a positive sign and inverting inputs and outputs are marked with a negative sign in some embodiments.

A switch may refer to any type of switching device including but not limited to transistors in some embodiments. A transistor may refer to any type of transistors including field effect transistors FETS, insulated gate FETs, bipolar junction transistors, etc. In some embodiments, the transistors are P-channel or N-channel metal oxide semiconductor field effect transistors (MOSFETs). A P-channel transistor includes a P channel, which is a channel composed of a majority of hole current carriers, between its source and drain. An N-channel transistor includes an N channel, which is a channel composed of a majority of electron current carriers, between its source and drain. The terms drain and source may be used interchangeably and may refer to a region of a transistor in some embodiments. A gate may refer to a transistor structure for controlling opening (e.g., towards a non-conductive state) and closing (e.g., towards a conductive state) of a transistor in some embodiments.

Injection locked oscillator 300 is configured to provide the eight phase signals for clock output 224 (FIG. 2), one phase signal at each of nodes 320, 322, 324, 326, 328, 330, 332, and 334. In some embodiments, the phase signal at node 320 corresponds to an in-phase phase signal, the phase signal at node 322 corresponds to a 180 degree phase delayed signal from the phase signal at node 320, the phase signal at node 324 corresponds a 225 degree phase delayed signal from the phase signal at node 320, the phase signal at node 328 corresponds a 90 degree phase delayed signal (e.g., a quadrature signal) from the phase signal at node 320, the phase signal at node 330 corresponds a 270 degree phase delayed signal from the phase signal at node 320, the phase signal at node 332 corresponds a 315 degree phase delayed signal from the phase signal at node 320, the phase signal at node 334 corresponds a 135 degree phase delayed signal from the phase signal at node 320, and the phase signal at node 326 corresponds a 45 degree phase delayed signal from the phase signal at node 320. In some embodiments, the eight phase signals are produced using a super harmonic injection architecture.

A transmitter may refer to any circuit for transmitting data across a medium (e.g., a cable) in some embodiments. A transmitter can include circuitry for encoding, modulating, processing and providing data in a serial fashion. A transmitter provides the data using a transmit clock signal in some embodiments. A receiver may refer to any circuit for receiving data from a medium (e.g., a cable) in some embodiments. A receiver can include circuitry for decoding, demodulating, processing and receiving data form a medium.

A clock signal may refer to an oscillating signal (e.g., a square wave signal or signal of other form) that oscillates between at least two states (e.g., a high and a low state) and is used in the transmission of transmit data in some embodiments. The use of clock signal system 200 provides improved receiver jitter tolerance, improved transmitter output jitter, and improved effective number of bits for communication systems. The clock signal can be a square wave signal, sinusoidal signal, trapezoidal signal, etc. A state may refer to any physical or virtual quantity or representation that varies with time or space or any other independent variable or variables in some embodiments. A state may be a particular code or combinations of codes in some embodiments.

In some embodiments, clock signal system 200 is implemented as a field-programmable gate array, an application-specific integrated circuit, hardware, a software executing processor, state machines, and combinations thereof. In some embodiments, a processing circuit which is part of a SERDES provides operations as described herein. The processing circuit can be configured to perform filtering, triggering and jitter reduction operations in some embodiments. Instructions for the processing circuit can be stored in a non-transitory medium such as memory in some embodiments. The memory may be one or more devices (e.g., RAM, ROM, Flash memory, hard disk storage) for storing data and/or computer code for completing and/or facilitating the various processes described herein. The memory may be or include non-transient volatile memory, non-volatile memory, and non-transitory computer storage media. Memory may include database components, object code components, script components, or any other type of information structure for supporting the various activities and information structures described herein. Memory may be communicably coupled to the processor circuit. The clock signal system 200 system may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments.

Figure 4:
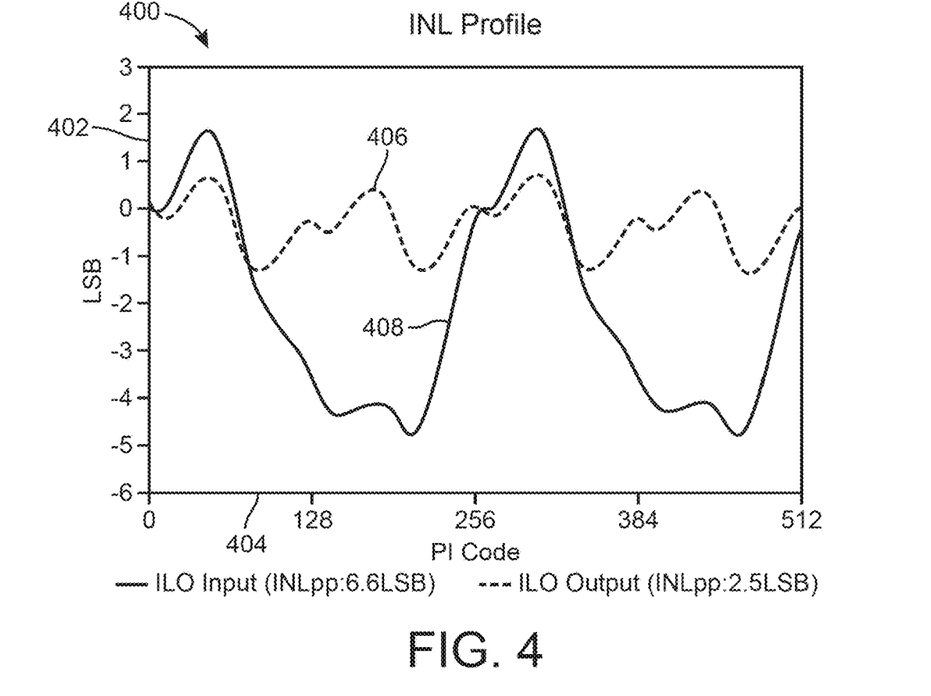
FIG. 4 is a waveform diagram depicting least significant bits of integral non-linearity versus phase interpolation code for the phase signals input to injection locked oscillator illustrated in FIG. 3 and the phase signals output by the injection locked oscillator illustrated in FIG. 3 according to some embodiments.

With reference to FIG. 4, a waveform 400 is related to INL performance for a 9 bit resolution phase interpolator at 28 giga hertz (GHz). A Y-axis 402 represents a least significant bit (LSB) for INL and an X-axis 404 represents the phase interpolator code. A curve 406 represents performance after injection locked oscillator 300 (FIG. 3), and a curve 408 represents performance before injection locked oscillator 300. Curves 406 and 408 show that the INL profile is improved for phase interpolator INL when using the injection locked oscillator 300 in some embodiments. Injection locked oscillator 300 suppresses PI INL from 6.6 LSB for 9 bit resolution to 2.5 LSB in some embodiments. The LSB is equal to 1/28 GHz/512 where the number 512 is a PI step size or resolution.

Figure 5:
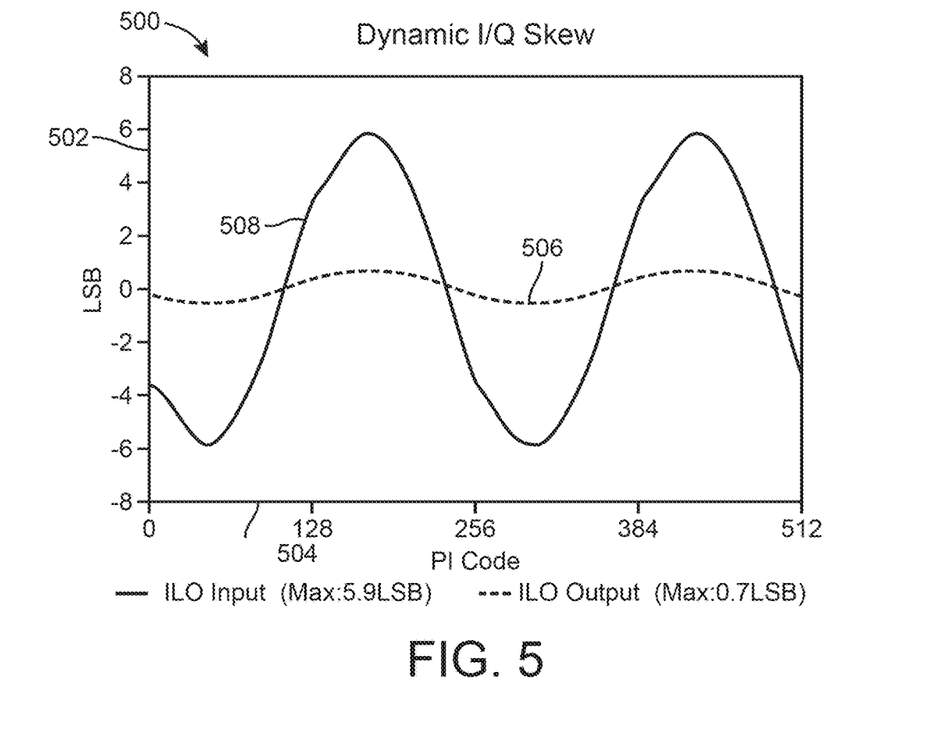
FIG. 5 is a waveform diagram depicting least significant bits of dynamic in-phase and quadrature skew versus phase interpolation code for the phase signals input to injection locked oscillator illustrated in FIG. 3 and the phase signals output by the injection locked oscillator illustrated in FIG. 3 according to some embodiments.

With reference to FIG. 5, a waveform 500 is related to dynamic skew performance for a 9 bit resolution phase interpolator at 28 GHz. A Y-axis 502 represents a least significant bit (LSB) for dynamic I/Q skew, and an X-axis 504 represents the phase interpolator code. A curve 508 represents performance before injection locked oscillator 300 (FIG. 3), and a curve 506 represents performance after injection locked oscillator 300. Curves 506 and 508 show that the dynamic I/Q profile is improved at clock output 224 when using the injection locked oscillator 300 in some embodiments. The maximum dynamic I/Q skew using injection locked oscillator 300 is reduced more than eight times (5.9 LSB to 0.7 LSB) in some embodiments. Symmetrical injection provides superior skew cancellation across all temperature, supply, and process corners, and device mismatch advantageously does not affect dynamic cancellation performance in some embodiments. The LSB is equal to 1/28 GHz/512 where the number 512 is a PI step size or resolution.

It should be noted that certain passages of this disclosure can reference terms such as "first" and "second" in connection with devices, frequencies, etc., for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., devices) that can operate within a system or environment. Communicatively coupling may refer to a condition where two or more devices are in direct or indirect communication with each other over a wireless or wired medium in some embodiments.

It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein. In the above description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features. Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. Circuit or circuitry may refer to any active or passive component and connections thereto as well as combinations thereof. Circuitry may further include or access instructions (e.g., software or firmware instructions) for execution by the circuitry. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:
1. A system, comprising:
a first phase interpolator;
a second phase interpolator;
a first circuit configured to receive a first signal and a second signal provided by the first phase interpolator and a third signal and a fourth signal provided by the second phase interpolator, wherein the first circuit is configured to provide at least eight phase signals, each of the eight phase signals being at a respective phase angle, in response to the first signal, the second signal, the third signal and the fourth signal; and
a second circuit configured to buffer a plurality of input signals related to the first signal, the second signal, the third signal, and the fourth signal, wherein the second circuit receives a first skew control signal.

2. The system of claim 1,
wherein the first circuit comprises a first amplifier and a first switch, wherein the first amplifier comprises a first inverting output and a first non-inverting output, wherein the first switch is disposed between the first non-inverting output and the first inverting output, wherein the first non-inverting output and the first inverting output each provide a respective one of the phase signals.

3. The system of claim 1, wherein the first circuit is configured as an injection locked oscillator.

4. The system of claim 1, wherein the first circuit comprises a plurality of amplifiers, wherein each of the amplifiers comprises an inverting output and a non-inverting output, wherein each of the non-inverting output and the inverting output provide one of the phase signals.

5. The system of claim 4, wherein the first circuit comprises a plurality of switches, wherein each switch is disposed between the non-inverting output and the inverting output of a respective one of the amplifiers.

6. The system of claim 5,
wherein the inverting output of a first amplifier of the amplifiers is coupled to the non-inverting input of a second amplifier of the amplifiers and the non-inverting output of the first amplifier is coupled to the inverting input of the second amplifier.

7. The system of claim 6, wherein an inverting output of the second amplifier is coupled to an inverting input of a third amplifier of the amplifiers and a non-inverting output of the second amplifier is coupled to a non-inverting input of the third amplifier.

8. The system of claim 4, wherein the amplifiers are operational amplifiers.

9. The system of claim 5, wherein the switches each comprise a gate configured to receive one of the first signal, the second signal, the third signal or the fourth signal.

10. The system of claim 9, wherein the first signal is an in-phase signal, and the third signal is a quadrature signal.

11. The system of claim 1, further comprising a third circuit configured to buffer the eight phase signals, wherein the third circuit receives a second skew control signal.

12. A device, comprising:
a first circuit configured to provide a first phase signal at a first inverting output and a second phase signal at a first non-inverting output, the first phase signal having a phase difference of 180 degrees with respect to the second phase signal;
a second circuit configured to receive the first phase signal at a second non-inverting input and the second phase signal at a second inverting input and provide a third phase signal at a second inverting output and a fourth phase signal at a second non-inverting output, the fourth phase signal having a phase difference of 180 degrees with respect to the third phase signal; and
a first switch configured to connect the first inverting output to the first non-inverting output in response to a first clock signal, wherein the first clock signal is provided by a first phase interpolator.

13. The device of claim 12, wherein the first circuit is configured as an injection locked oscillator.

14. The device of claim 12, further comprising:
a third circuit configured to receive the third phase signal at a third inverting input and the fourth phase signal at a third non-inverting input and provide a fifth phase signal at a third inverting output and a sixth phase signal at a third non-inverting output, the fifth phase signal having a phase difference of 180 degrees with respect to the sixth phase signal; and
a second switch configured to connect the second inverting output to the second non-inverting output in response to a second clock signal, the second clock signal having a phase difference of 90 degrees with respect to the first clock signal.

15. The device of claim 14, further comprising:
a fourth circuit configured to receive the fifth phase signal at a fourth non-inverting input and the sixth phase signal at a fourth inverting input and provide a seventh phase signal at a fourth inverting output and an eighth phase signal at a fourth non-inverting output, the seventh phase signal having a phase difference of 180 degrees with respect to the eighth phase signal; and
a third switch configured to connect the third inverting output to the third non-inverting output in response to a third clock signal, the third clock signal having a phase difference of 180 degrees with respect to the first clock signal.

16. The device of claim 15, further comprising a fourth switch, wherein the fourth non-inverting output is coupled to a first non-inverting input of the first circuit and the fourth inverting output is coupled to a first inverting input of the first circuit; and
wherein the fourth switch configured to connect the fourth inverting output to the fourth non-inverting output in response to a fourth clock signal, the fourth clock signal having a phase difference of 270 degrees with respect to the first clock signal.

17. A method, comprising:
providing a first clock signal, a second clock signal, a third clock signal and a fourth clock signal to a second buffer;
correcting skew associated with the first clock signal, the second clock signal, the third clock signal and the fourth clock signal in the second buffer using a second skew control signal;
providing the first clock signal, the second clock signal, the third clock signal and the fourth clock signal to a first phase interpolator from the second buffer and the first clock signal, the second clock signal, the third clock signal and the fourth clock signal from the second buffer to a second phase interpolator;
receiving the first clock signal and the second clock signal provided by the first phase interpolator;
receiving the third clock signal and the fourth clock signal provided by the second phase interpolator, the first clock signal, the second clock signal, the third clock signal, and the fourth clock signal each being at a respective phase angle;
using an oscillator to provide a plurality of phase signals, each being at a respective phase angle, wherein the number of the phase signals is more than four; and
providing the phase signals to a first buffer and correcting skew associated with the phase signals in the first buffer using a first skew control signal.

18. The method of claim 17, further comprising:
controlling switches in the oscillator using the first clock signal, the second clock signal, the third clock signal, and the fourth clock signal.

19. The method of claim 18, wherein the oscillator is configured as an injection locked oscillator.

20. The method of claim 17,
wherein the oscillator comprises a plurality of switches, wherein each switch is disposed between the non-inverting output and the inverting output of a respective one of the amplifiers.

* * * * *